United States Patent
Buhmann et al.

(10) Patent No.: US 8,773,293 B2
(45) Date of Patent: Jul. 8, 2014

(54) MEASUREMENT SIGNAL CORRECTION APPARATUS AND METHOD FOR CORRECTING A MEASUREMENT SIGNAL

(75) Inventors: Alexander Buhmann, Routligen (DE); Marian Keck, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 151 days.

(21) Appl. No.: 13/368,077

(22) Filed: Feb. 7, 2012

(65) Prior Publication Data

US 2012/0198909 A1 Aug. 9, 2012

(30) Foreign Application Priority Data

Feb. 8, 2011 (DE) .......................... 10 2011 003 736

(51) Int. Cl.
*H03M 1/06* (2006.01)
*G01D 5/244* (2006.01)

(52) U.S. Cl.
CPC .................................. *G01D 5/2448* (2013.01)
USPC ............ 341/118; 341/155; 341/120; 341/119

(58) Field of Classification Search
CPC ................................................... G01D 5/2448
USPC .................................. 341/118, 155, 119, 120
See application file for complete search history.

(56) References Cited

U.S. PATENT DOCUMENTS

| 5,563,535 | A | * | 10/1996 | Corry et al. ................... 327/105 |
| 6,707,408 | B2 | * | 3/2004 | Guedon et al. ................ 341/143 |
| 6,870,629 | B1 | | 3/2005 | Vogel et al. |
| 7,405,685 | B2 | * | 7/2008 | Rezeq et al. .................. 341/143 |
| 2001/0024204 | A1 | | 9/2001 | Eglit |
| 2003/0043945 | A1 | | 3/2003 | Mujica et al. |
| 2008/0315928 | A1 | | 12/2008 | Waheed et al. |
| 2010/0060495 | A1 | * | 3/2010 | Asami et al. .................. 341/118 |

* cited by examiner

*Primary Examiner* — Jean B Jeanglaude
(74) *Attorney, Agent, or Firm* — Maginot, Moore & Beck

(57) ABSTRACT

A measurement signal correction apparatus includes an analog/digital converter, a correction factor providing unit, and a measurement signal correction unit. The analog/digital converter is configured to convert an analog measurement signal read in using an interface into a digital measurement signal using a reference frequency signal. The correction factor providing unit is configured to provide a correction factor determined on the basis of the reference frequency signal. The measurement signal correction unit is configured to multiply the digital measurement signal by the correction factor in order to obtain a corrected measurement signal.

9 Claims, 3 Drawing Sheets

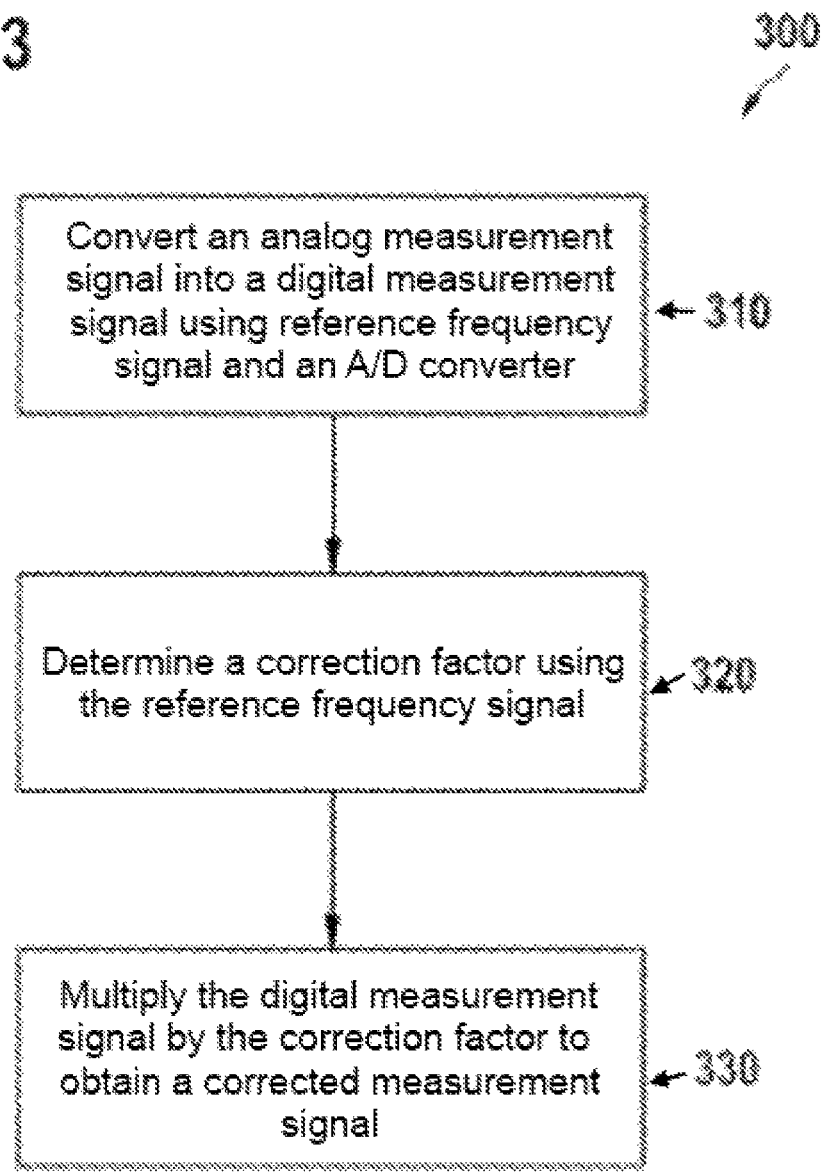

MEASUREMENT SIGNAL CORRECTION APPARATUS AND METHOD FOR CORRECTING A MEASUREMENT SIGNAL

This application claims priority under 35 U.S.C. §119 to German patent application no. 10 2011 003736.5, filed on Feb. 8, 2011 in Germany, the disclosure of which is incorporated herein by reference in its entirety.

BACKGROUND

The present disclosure relates to a measurement signal correction apparatus, to a use of the measurement signal correction apparatus for converting an analog measurement signal of a rate-of-rotation sensor measurement signal, to a method for correcting a measurement signal and to a corresponding computer program product.

In order to suppress the effect of clock edge fluctuation (clock jitter) in force-compensated rate-of-rotation sensors, a high-resolution reference oscillator has previously been required.

US 2008 031 59 28 A1 shows a phase locked loop which operates in response to clock signals produced by means of an RF clock signal from the phase locked loop. A frequency desired value input provides a reference clock. A controllable oscillator generates the RF clock signal.

SUMMARY

Against this background, the present disclosure presents a measurement signal correction apparatus, a use of the measurement signal correction apparatus for converting an analog measurement signal of a rate-of-rotation sensor measurement signal, a method for correcting a measurement signal and finally a corresponding computer program product. Advantageous refinements emerge from the following description.

The present disclosure provides a measurement signal correction apparatus having the following features (i) an analog/digital converter which is designed to convert an analog measurement signal read in using an interface into a digital measurement signal using a reference frequency signal, (ii) a correction factor providing unit for providing a correction factor determined on the basis of the reference frequency signal, and (iii) a measurement signal correction unit which is designed to multiply the digital measurement signal by the correction factor in order to obtain a corrected measurement signal.

In the present case, a measurement signal correction apparatus can be understood as meaning an electrical device which processes sensor signals and outputs corrected measurement signals on the basis of said sensor signals. The measurement signal correction apparatus may have at least one interface which may be designed using hardware and/or software. In the case of a hardware design, the interface(s) may be, for example, part of a so-called system ASIC which comprises a wide variety of functions of the apparatus. However, it is also possible for the interfaces to be separate, integrated circuits or to at least partially consist of discrete components. In the case of a software design, the interfaces may be software modules which are present, for example, in a microcontroller in addition to other software modules.

The present disclosure also provides a method for correcting a measurement signal, the method including (i) converting an analog measurement signal read in using an interface into a digital measurement signal using a reference frequency signal by means of an analog/digital converter, (ii) providing a correction factor which was determined using the reference frequency signal, and (iii) multiplying the digital measurement signal by the correction factor in order to obtain a corrected measurement signal.

A computer program product having program code, which can be stored on a machine-readable carrier, such as a semiconductor memory, a hard disk memory or an optical memory, and is used to carry out the method according to one of the embodiments described above when the program is executed on a device corresponding to a computer, is also advantageous.

An analog measurement signal can be understood as meaning a signal from any desired sensor which converts a physical variable into an analog electrical variable. In this case, the analog measurement signal may be read in via an interface, with the result that a sensor for providing the analog measurement signal need not necessarily be part of the correction apparatus presented here. A reference frequency signal can be understood as meaning a signal which represents a clock signal of the analog/digital converter. The correction factor providing unit may be designed as an interface which does not necessarily need to determine the correction factor on the basis of the reference frequency signal. Rather, the correction factor which has already been determined (by another unit) can be read in and can be supplied to the measurement signal correction unit.

The present disclosure is based on the knowledge that technically very simple correction of a measurement signal should be carried out in the digital section of a measurement signal evaluation system. In this case, it should be taken into account that an analog/digital converter is clocked by a reference frequency signal, with the result that, in the event of clock fluctuations of the reference frequency signal, these fluctuations result in errors in the digital measurement signal. These errors can now be compensated for by using a correction factor which is multiplied by the digital measurement signal in order to obtain the corrected measurement signal, the correction factor being determined using the reference frequency signal. This makes it possible to correct errors in the digital measurement signal which are caused by fluctuations in the reference frequency signal.

The present disclosure provides the advantage that errors in the digital measurement signal can be compensated for in the digital section of the measurement signal evaluation system, with the result that there is no need to change the analog components of the evaluation system in a complicated manner. At the same time, it becomes possible to implement the approach according to the disclosure in a numerically simple manner or a manner which is simple in terms of circuitry by multiplying the digital measurement signal by the correction factor.

According to one embodiment of the present disclosure, the correction factor providing unit can be designed to also determine the correction factor on the basis of a parameter of the analog measurement signal. Such a parameter of the analog measurement signal may be, for example, a period duration or a frequency. Such an embodiment of the present disclosure provides the advantage that the correction factor can be specifically set to the analog measurement signal to be converted and a high level of precision thus becomes possible when correcting the analog measurement signal.

It is favorable if the correction factor providing unit is designed to average a parameter, in particular a period duration, of the reference frequency signal and to use it when determining the correction factor. Such an embodiment of the present disclosure provides the advantage that the correction factor can be determined on the basis of evaluation of the reference frequency signal which lasts for a longer period of time. This makes it possible to detect a current deviation of the parameter of the reference frequency signal from an average value of the parameter of the reference frequency signal in an improved manner, with the result that more accurate determination of the correction factor to be currently used becomes possible.

According to a particular embodiment of the present disclosure, the correction factor providing unit can also be designed to provide, as the correction factor, a value which was determined using a ratio between the reference frequency signal or a value derived therefrom and the averaged parameter of the reference frequency signal. For example, a ratio of a current period duration or sampling period of the reference frequency signal to an averaged period duration or sampling period of the reference frequency signal can be determined in this case as the correction factor. Such an embodiment of the present disclosure provides the advantage that the use of a correction factor determined in this manner makes it possible to compensate very well for an error in the digital measurement signal which is caused by a clock edge fluctuation of the reference frequency signal during the analog/digital conversion.

According to another embodiment of the present disclosure, the correction factor providing unit can also be designed to update the correction factor with a rate which is dependent on a parameter of the analog measurement signal and/or a parameter of the reference frequency signal, in which case, in particular, the rate is dependent on a ratio between a frequency of the analog measurement signal and/or a frequency of the reference frequency signal. Such an embodiment of the present disclosure provides the advantage that very good correction of the digital measurement signal in terms of time becomes possible by updating the correction factor with said rate. In particular, an individual correction factor, for example, can be determined in this manner for each value of the digital measurement signal which has been subjected to analog/digital conversion.

In one particular embodiment of the present disclosure, a digital phase locked loop for providing the reference frequency signal from an oscillator signal may also be provided, in which case, in particular, the digital phase locked loop has a numerically controlled oscillator. Such an embodiment of the present disclosure provides the advantage that, on the one hand, a digital and thus cost-effective circuit for providing the reference frequency signal can be provided and, on the other hand, a parameter for determining the correction factor can be very easily tapped off from such a digital phase locked loop. For example, when using a numerically controlled oscillator, a counter reading of this oscillator can be very easily used to determine the correction factor.

According to another embodiment of the present disclosure, the analog/digital converter can be designed to carry out a conversion using the delta/sigma modulation method. Such an embodiment of the present disclosure provides the advantage that a high sampling rate of the analog signal in comparison with the bandwidth of the useful signal becomes possible compared to other A/D conversion principles. As a result of the continuous sampling at the input, there is also no need for an additional hold circuit. In addition, low demands are imposed on an analog anti-aliasing filter.

It is particularly advantageous if the measurement signal correction apparatus described above is used to convert an analog measurement signal of a rate-of-rotation sensor into a corrected measurement signal. Such an embodiment of the present disclosure provides the advantage that, particularly in the case of force-compensated rate-of-rotation sensors, the feedback force on average corresponds to the Coriolis force, with the result that rate-of-rotation sensors, in particular, are particularly sensitive to clock edge fluctuations during sampling. The use of the abovementioned measurement signal correction apparatus therefore makes it possible to use less precise and consequently more cost-effective oscillators for the purpose of providing the reference frequency signal for the analog/digital conversion, a corrected measurement signal with a high Q-factor nevertheless being obtained.

BRIEF DESCRIPTION OF THE DRAWINGS

The disclosure is explained in more detail by way of example below using the accompanying drawings, in which:

FIG. 3 shows a flowchart of an exemplary embodiment of the present disclosure as a method.

DETAILED DESCRIPTION

In the following description of preferred exemplary embodiments of the present disclosure, the same or similar reference symbols are used for the similarly acting elements illustrated in the different figures, in which case a repeated description of these elements is dispensed with.

Figure 1:
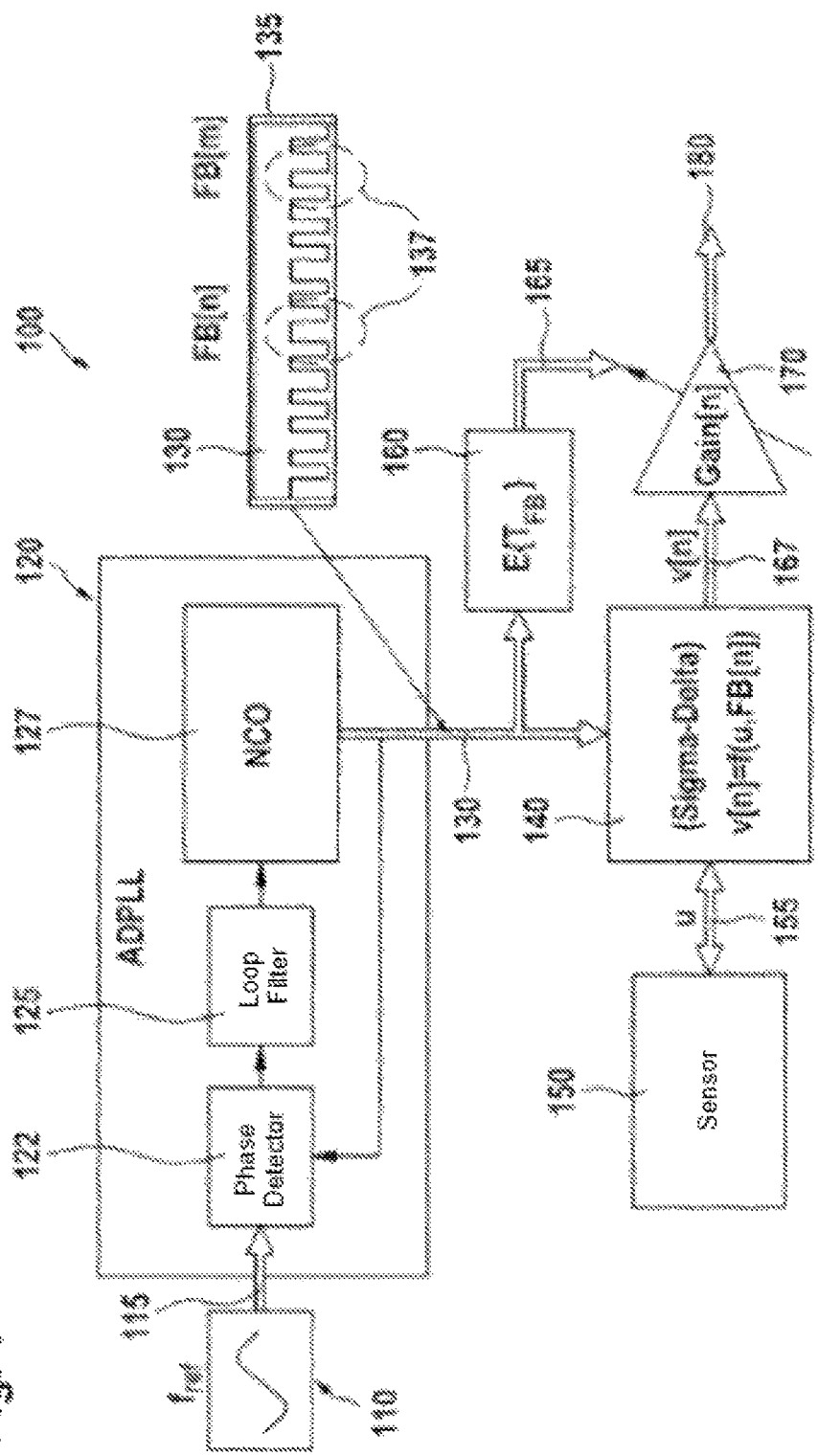
FIG. 1 shows a block diagram of a measurement signal conditioning unit in which a measurement signal correction apparatus according to one exemplary embodiment of the present disclosure is used.

FIG. 1 shows a block diagram of a measurement signal conditioning system in which a measurement signal correction apparatus 100 according to one exemplary embodiment of the present disclosure is used. An oscillator 110 provides a clock signal 115 which is processed further in a digital phase locked loop 120. For this purpose, the clock signal 115 in the digital phase locked loop 120 is first of all detected by a phase detector 122 in which a phase of the clock signal 115 is detected. The phase locked loop 120 also comprises a loop filter 125 for filtering the signal obtained from the phase detector 122, for example the detected phase. A signal filtered by the loop filter 125 is then processed by a numerically controlled oscillator 127 (NCO) which comprises a counter, for example. This numerically controlled oscillator 127 outputs a reference frequency signal 130 which is used as the free-running clock for an analog/digital converter 140 which operates, for example, on the basis of sigma/delta modulation. Feeding the reference frequency signal 130 back into the phase detector 122 makes it possible to reset the numerically controlled oscillator 127 which may result in irregular distances between clock edges in the reference frequency signal, as becomes clear in the graph 135 by comparing the two temporally offset signal regions 137. In this case, the designations FB[n] and FB[m] denote lengths of successive clock cycles FB of the reference frequency signal 130 provided by the digital phase locked loop 120. In the case of such a free-running clock signal, such a considerable deviation of the distance between signal edges in comparison with preceding and/or following clock signal edges may occur, particularly when resetting the numerically controlled oscillator 127. Such a deviation of the distance between clock signal edges is also referred to as jitter.

In order to prevent such jitter resulting in erroneous analog/digital conversion of the analog measurement signal 155 read in from the sensor 150 (for example a rate-of-rotation sensor) in the analog/digital converter 140, provision is made of a correction factor providing unit 160 which provides a correction factor 165 which was determined on the basis of the reference frequency signal 130. The digital measurement signal 167 provided by the analog/digital converter 140 is processed in a measurement signal correction unit 170 using this correction factor 165 in order to obtain the corrected measurement signal 180. In this case, the correction factor 165 is multiplied by the digital measurement signal 167, in particular, in the measurement signal correction unit 170 in order to obtain the corrected measurement signal 180.

Using the abovementioned approach thus makes it possible to reduce or compensate for the effect of the clock edge fluctuation in the reference frequency signal 130 on the (for example rate-of-rotation) measurement signal 155 by digitally correcting the digital measurement signal 167 output by the analog/digital converter 140. In this case, an important aspect of the disclosure can be seen to be a measurement or estimation of the absolute clock duration of an analog/digital converter 140, the output signal 167 v[n] (=f(u, FB [n])) of which is a function of the clock duration of FB[n] of the reference frequency signal 130, with subsequent digital correction of this signal 167. An advantage of this approach is the comparatively simple implementation in the digital section since there is no need for any change in the analog section (for example the sensor 150) or to the reference oscillator 110 or 120 for this purpose and this approach is thus very highly suitable for force-compensated rate-of-rotation sensors.

FIG. 1 thus shows a block diagram of an overall system model of measurement signal correction, consisting of ADPLL 120 for generating the reference clock 130. This reference clock 130 is used for the AD conversion 140 and results in an erroneous output signal v as a result of its phase jitter (FB[n]!=FB[m]). The error can be completely corrected by means of subsequent digital correction 170 with a gain factor 165 (Gain[n]).

In this case, the absolute clock duration of the analog/digital converter 140 is measured/estimated by the digital phase locked loop ADPLL 120 (ADPLL=All Digital Phase Locked Loop) of the primary oscillator 110. This phase locked loop 120 provides the clock 130 for the entire subsequent digital signal processing using the components of the analog/digital converter 140, the correction factor providing unit 160 and the measurement signal correction unit 170 and has high long-term stability and temperature stability on account of the controlled synchronicity with the sensor element 150. However, since the ADPLL 120 is implemented using an NCO 127 and the latter can implement most (output) frequencies, such as the reference frequency signal, only by means of averaging, such generation of the clock signal, such as the reference frequency signal 130, for downstream components results in clock cycles of different lengths, as illustrated in the graph 135 in FIG. 1. The clock fluctuation corresponds at least to the clock of the reference oscillator of the ADPLL, apart from the fact that the clock of the reference oscillator is double the sensor resonance of the primary oscillator since no clock edge fluctuation then occurs.

An analog/digital converter 140, the digital output signal v[n] of which is a function of the actual measurement variable u and the period duration $T_{FB}$ of the clock signal 130, now generates an erroneous output signal v[n]. In this case, $T_{FB}$ represents the period duration between two NCO edges (that is to say between two edges of the reference frequency signal 130) during the conversion or feedback phase FB[n]. In this case, FB[n] describes the state and $T_{FB}$[n] is a characteristic of this state. This problem of A/D conversion which is subject to jitter is of increased significance, in particular, in the case of force-compensated rate-of-rotation sensors as measurement signal transducers in which the feedback force $F_{FB}$ on average corresponds to the Coriolis force (that is to say in which $F_{Coriolis}[n]=F_{FB}[n]=F_{electrostatics} \cdot T_{FB}[n]/T_S \sim v[n]$, where $F_{electrostatics}$ is a force which is measured). With typical designs, the feedback force is applied for 2/16 ... 5/16 of a sampling period $T_S$ of the reference frequency signal 130. The smallest clock fluctuation corresponds at least to the clock of the reference oscillator 110 of the ADPLL 120 if said clock is not an exact multiple of the frequency of the reference oscillator 110. The clock fluctuation becomes zero in the case of an exact multiple.

The idea on which this exemplary embodiment of the present disclosure is based involves digitally correcting the digital output signal v[n] from the analog/digital converter 140 by determining or estimating the clock period of the reference frequency signal 130, that is to say $T_{FB}$[n] or FB[n], and thus cancelling the influence of the clock fluctuations in the reference frequency signal 130, as illustrated in the graph 135 in FIG. 1. The correction factor 165 which is used in the measurement signal correction unit 170 as Gain[n] (that is to say correction factor) is determined from the ratio $T_{FB[n]/Mean(TFB)}$. In this case, Mean($T_{FB}$) represents the mean value of the period duration of the reference frequency signal 130 (or else a reference value) which is assumed to be °/s, for example, for the conversion. This abovementioned ratio can be determined and provided as the correction factor 165 in the correction factor providing unit 160. An expected value $E\{T_{FB}\}$ can therefore be formed or an averaging operation can be carried out in the correction factor providing unit 160 in order to determine this mean value for the period duration or sampling period of the reference frequency signal 130, this mean value then being used, as described above, to form a ratio, for example, when determining the correction factor 165.

Another idea is that this averaging by the NCO 127 can be predicted using the last NCO counter reading. This value can then be simply used to weight the delta/sigma output of the analog/digital converter 140. The feedback force is thus normalized in the digital region. Since the feedback force, more precisely the delta/sigma data stream, is a measure of the mechanical rate of rotation, this value is no longer influenced by the clock length fluctuation and the rate of rotation is thus estimated in an improved manner with less noise. This is simply a multiplication which can be easily carried out inside an FPGA or DSP using the manipulated variable of the ADPLL controller.

In a typical embodiment, the NCO 127 has a fundamental frequency of 200 MHz and the reference oscillator (in the sensor element 150) has a frequency of 15 kHz. This results in a typical value of 0.26 μs for the feedback duration and thus approximately 52 NCO clock cycles per feedback operation of the digital phase locked loop 120. This value now fluctuates between 52 and 51, for example, on account of the averaging property of the NCO 127. If the digital output data stream v[n] from the analog/digital converter 140 is multiplied by 51/52 (that is to say such a ratio referred to as Gain[n]) for the periods with shorter feedback, the corrected measurement signal value 180 is obtained from v[n]. For example, in the case of counter readings in time with the feedback in the NCO 127 in the sequence 51, 52, 52, 51, 52, 52, 51, a gain correction value 165 can be respectively output in the sequence 51/52, 1, 1, 51/52, 1, 1, 51/52. The correction factor 165 is updated in this manner with a feedback rate of the digital phase locked loop 120, with the result that a suitable correction factor 165 is respectively provided by the correction factor providing unit 160 for each measured value v[n] 167 which has been subject to analog/digital conversion in order to obtain a measured value 180 which has been corrected as optimally as possible.

Figure 2A:
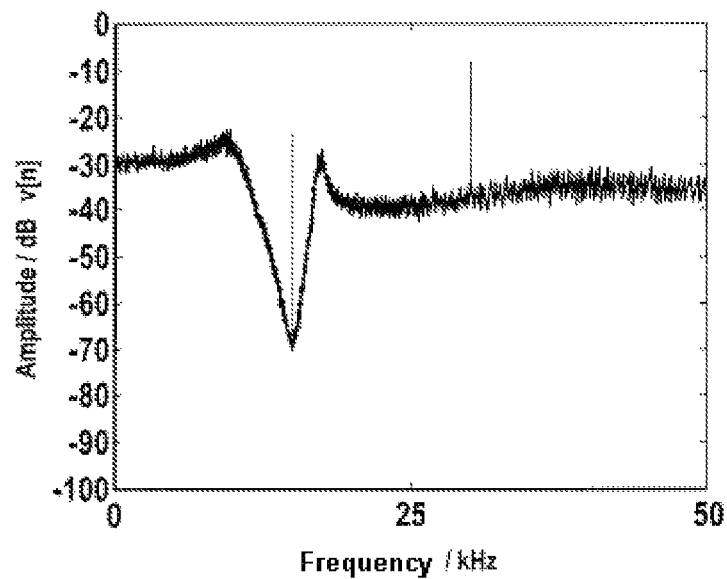
FIG. 2 shows two graphs of measured noise transfer functions without using (FIG. 2A, left) and using (FIG. 2B, right) the approach according to the disclosure.
Figure 2B:
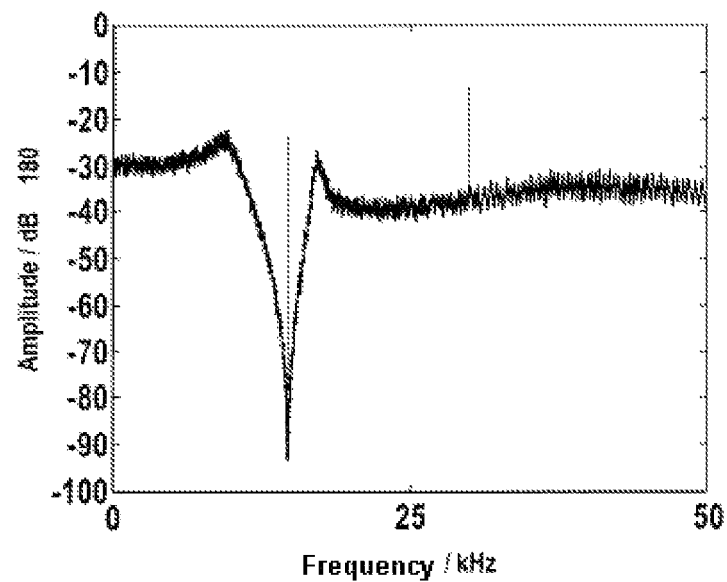

The effect of such correction of the digital measurement signal 167 v[n], as described above, is shown, for example, in the application of a rate-of-rotation sensor measurement signal with force compensation in FIG. 2. In the two partial graphs in FIG. 2, the frequency in kHz is respectively plotted on the abscissa and the amplitude of the evaluated measurement signal v[n] 165 and 180 in dB is plotted on the ordinate. The effect of the clock edge fluctuation in an erroneous digital measurement signal 167 v[n] can be seen as the filling of the "notch" in the illustration on the left-hand side, that is to say in FIG. 2A. After digital correction, that is to say for the corrected measurement signal 180, the profile of the measurement curve in the partial graph on the right-hand side, that is to say in FIG. 2B, no longer exhibits this filling behavior in the spectral profile and thus enables a far higher rate-of-rotation resolution despite the use of an oscillator 110 with severe clock edge fluctuation.

FIG. 2 thus shows measured delta/sigma noise transfer functions without (FIG. 2A, left) and with (FIG. 2B, right) digital jitter compensation. The noise suppression ("Notch") in the signal band around 15 kHz is considerably greater as a result of the jitter compensation. In this case, the NCO 127 has a clock frequency of 50 MHz since this is an FPGA implementation.

The clock duration can be determined by an additional counter which begins with the rising clock edge of FB[n], stops with the falling clock edge of FB[n] and the clock of which directly results from the NCO 127.

Alternatively, the correction value Gain[n] 165 can also be directly predicted by means of the last counter reading of the NCO 127. Therefore, an additional block does not need to estimate or determine the clock duration $T_{FB}$/FB[n]. This value 165 can then be used to weight the data stream v[n] and thus to normalize the feedback force in the digital region. This is simply a multiplication which can be efficiently carried out inside an FPGA or DSP using the manipulated variable of the ADPLL controller. Alternatively, different PLLs based on an NCO can also be used.

The approach presented here can be used in a promising manner in future rate-of-rotation sensors, in particular in the automotive and consumer electronics sectors.

FIG. 3 shows a flowchart of an exemplary embodiment of the present disclosure as a method 300 for correcting a measurement signal. The method has converts 310 an analog measurement signal read in using an interface into a digital measurement signal using a reference frequency signal and an analog/digital converter. The method 300 also provides 320 a correction factor which was determined using the reference frequency signal. Finally, the method 300 comprises multiplying 330 the digital measurement signal by the correction factor in order to obtain a corrected measurement signal.

The exemplary embodiments described and shown in the figures are selected only by way of example. Different exemplary embodiments may be combined with one another in full or with respect to individual features. One exemplary embodiment may also be supplemented with features of another exemplary embodiment.

Furthermore, the method according to the disclosure may be repeatedly carried out and may be carried out in an order other than the order described.

What is claimed is:

1. A measurement signal correction apparatus comprising:
an analog/digital converter configured to receive an analog measurement signal and a reference frequency signal and to convert the analog measurement signal into a digital measurement signal based on the reference frequency signal;
a correction factor providing unit configured to receive the reference frequency signal and to output a correction signal indicating a correction factor for the digital measurement signal, the correction factor being determined on the basis of the reference frequency signal; and
a measurement signal correction unit configured to receive the digital measurement signal and the correction signal and to output a corrected measurement signal, the corrected measurement signal being obtained by multiplying the digital measurement signal by the correction factor.

2. The measurement signal correction apparatus according to claim 1, wherein the correction factor providing unit is further configured to also determine the correction factor on the basis of a parameter of the analog measurement signal.

3. The measurement signal correction apparatus according to claim 1, wherein the correction factor providing unit is further configured to average a parameter, in particular a period duration, of the reference frequency signal.

4. The measurement signal correction apparatus according to claim 3, wherein the correction factor providing unit is further configured to provide, as the correction factor, a value which was determined using a ratio between the reference frequency signal or a value derived therefrom and the averaged parameter of the reference frequency signal.

5. The measurement signal correction apparatus according to claim 1, wherein the correction factor providing unit is further configured to update the correction factor with a rate which is dependent on a parameter of the analog measurement signal and/or a parameter of the reference frequency signal, in which case, in particular, the rate is dependent on a ratio between a frequency of the analog measurement signal and/or a frequency of the reference frequency signal.

6. The measurement signal correction apparatus according to claim 1, further comprising:
a digital phase locked loop for providing the reference frequency signal from an oscillator signal, the digital phase locked loop including a numerically controlled oscillator.

7. The measurement signal correction apparatus according to claim 1, wherein the analog/digital converter is configured to convert the analog measurement signal into a digital measurement signal based on the reference frequency signal using a delta/sigma modulation method.

8. The measurement signal correction apparatus according to claim 1, wherein the measurement signal correction apparatus is used for converting an analog measurement signal of a rate-of-rotation sensor into a corrected measurement signal.

9. A method for correcting a measurement signal, comprising:
supplying a reference frequency signal to an analog/digital converter and a correction factor providing unit;
using the analog/digital converter to convert an analog measurement signal to a digital measurement signal using the reference frequency signal;
using the correction factor providing unit to determine a correction factor for the digital measurement signal using the reference frequency signal; and
multiplying the digital measurement signal by the correction factor in order to obtain a corrected measurement signal.

* * * * *